United States Patent [19]

Okada et al.

[11] Patent Number: 4,774,521
[45] Date of Patent: Sep. 27, 1988

[54] RESONANT MARKER FOR USE WITH RADIO FREQUENCY ELECTRONIC ARTICLE SURVEILLANCE SYSTEM

[75] Inventors: Sadao Okada, Tokyo; Kazunori Umezawa, Yokohama, both of Japan

[73] Assignee: Minnesota Mining and Manufacturing Company, St. Paul, Minn.

[21] Appl. No.: 911,813

[22] Filed: Sep. 26, 1986

[30] Foreign Application Priority Data

Sep. 30, 1985 [JP] Japan .......................... 60-149550[U]

[51] Int. Cl.⁴ .............................................. H01Q 1/36
[52] U.S. Cl. ..................................... 343/895; 340/572
[58] Field of Search .......................... 343/895; 340/572

[56] References Cited

U.S. PATENT DOCUMENTS 4,509,039  4/1985  Dowdle ................................ 340/572

Primary Examiner—William L. Sikes
Assistant Examiner—Robert E. Wise
Attorney, Agent, or Firm—Donald M. Sell; William B. Barte

[57] ABSTRACT

A resonant marker for use with an RF electronic article surveillance system, said marker having a resonant circuit combining a flat coil with a condenser, adapted to be mounted on an article so as to be located by a goods monitoring apparatus by radio waves, characterized by setting a portion of said coil almost perpendicularly to the plane including the remainder of the coil.

1 Claim, 1 Drawing Sheet

RESONANT MARKER FOR USE WITH RADIO FREQUENCY ELECTRONIC ARTICLE SURVEILLANCE SYSTEM

FIELD OF THE INVENTION

The present invention relates to a marker containing an inductor coil and capacitor circuit for use in an electronic article surveillance (EAS) system and is particularly effective when secured to housings for compact disks (hereinafter referred to as CD), wherein the compact disks contain a conductive surface which could shield the coil if affixed to the housing so as to be placed over the conductive surface.

BACKGROUND OF THE INVENTION

So far there have been known some RF based EAS systems such as those disclosed in U.S. Pat. No. 4,509,039. Such apparatus radiate a radio frequency field at a specified frequency in the surveillance zone through which the article may pass, and produces an alarm upon the detection of current induced by a resonant circuit within the marker, which is secured to the article.

A resonant circuit in the marker is typically composed of a flat or planar coil in combination with a capacitor. In order that the system can detect the marker, it is necessary that a radio frequency field radiated from the system pass through the coil. However, if the marker is positioned adjacent to an article having a metallized or otherwise conductive surface, such as covered with aluminum or other metal films, metal foils or metal plates, the conductive surface will shield the coil from the radio frequency field and thereby cause the distance from the system at which the marker can be detected to become so short as to be unacceptable.

A method which previously has been employed for preventing the marker from overlapping an article such as CD and thereby being shielded from radio frequency fields, uses a hard case 11 as shown in FIG. 3. The hard case 11 consists of a portion A for receiving the CD and a portion B neighboring this. The portion B is provided with a tag pocket 12 into which a marker containing a planar coil 1 is placed.

However, many problems exist with the method mentioned above, such as the high cost due to the special requirement of a hard case, the need for a space within the hard case, and others.

Accordingly, the object of the present device is to solve the problems of the previous methods as mentioned above and to provide a marker for radio frequency EAS systems which is low cost and requires no special space.

SUMMARY OF THE INVENTION

According to the present invention, a resonant marker is provided which includes a resonant inductive-capacitive (LC) circuit comprising a flat coil adapted to be secured to an article so as to be detected by an EAS system, wherein a portion of the coil is configured such that it is out of the plane of the remainder of the coil. Preferably, such a portion is positioned almost perpendicular to the plane of the remainder of the coil.

In the present invention, it has been found that even if an article is covered with or contains a layer of metal, metal films, metal foils or metal plates which have properties to shield radio frequency fields (hereinafter referred to as shield materials), there is a small surface portion in the edge part of a case or housing the like of which contains the article which is not covered with the shield materials. Thus, a marker in which a portion of the coil is set almost perpendicularly to the plane of the remainder of the coil may be mounted on the case or the like in order that at least a portion of the coil is not parallel with the conductive layer in the article. That portion, therefore, will not be shielded from the RF field. Thus in the marker of the present invention, at least a portion of the coil is folded over and placed such that when the marker is attached to a case, the folded over portion of the coil will be adjacent the edge portion of the case. In such an event, the non-folded over portion of the coil may overlap the conductive, shielded area. If the extent of overlap is significant, the distance of detectability may be significantly reduced, hence it is desirable to provide an area adjacent the edge in which no conductive shield materials are present, and over which the folded portion of the coil may extend.

In one embodiment, the resonant circuit according to the present invention may include two flat or planar coils between which an insulator exists, such that the capacitive element is formed by the metal foils constituting the coils in combination with the insulator. Such a circuit may be folded over such that when secured around the edge of a CD enclosure as described above, a portion of the coils will extend around that edge.

DETAILED DESCRIPTION

The present invention is explained further in detail based on the following examples. For convenience, the case or housing for a compact disk (CD) is described as the article to be detected.

Figure 1:
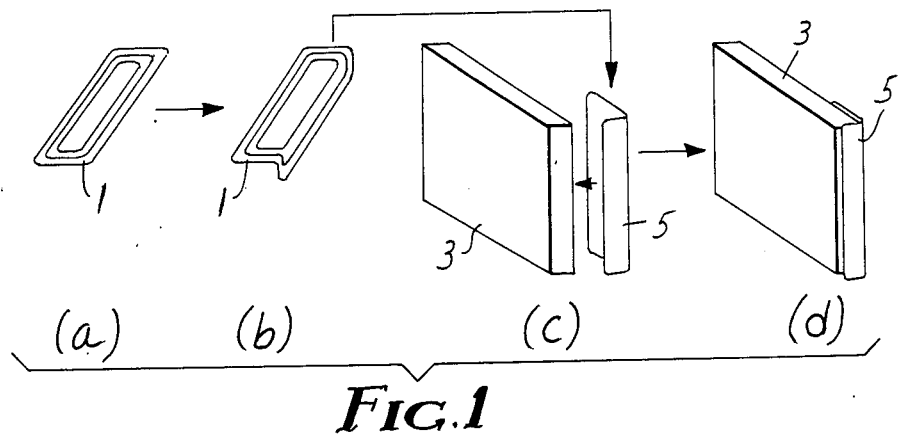
FIGS. 1a, 1b, 1c, and 1d is a schematic illustration showing an example in which a resonant marker according to the present invention is adapted to be mounted on a housing adapted to receive a compact disk.
Figure 2:
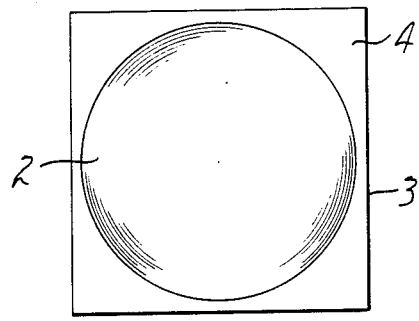
FIG. 2 is a top view showing the compact disk housing of FIG. 1.
Figure 3:
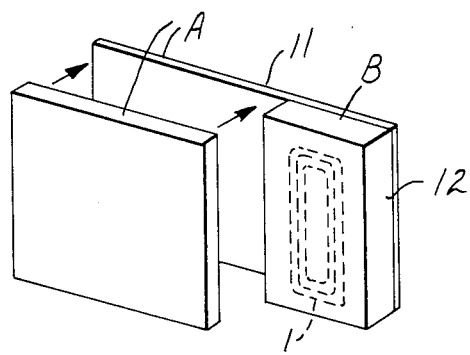
FIG. 3 is a schematic illustration showing a CD housing in which a conventional marker of the prior art is used.

As shown in FIG. 2, in a CD case 3 which contains a CD 2, there are four corner portions 4. Thus, as shown in FIG. 1, a flat or planar coil 1 which has a nearly rectangular form is partly bent at opposing short sides adjacent a long side so that the plane of one long side is substantially perpendicular to the plane of the other long side and is inserted into a marker housing 5 which has a L shape cross section and which is adapted to be mounted on an edge of the CD case 3. The planar coil can be folded into a non-planar configuration to varying degrees, depending on the configuration of the article to which the marker is to be affixed. It is desirable that the final configuration be such that the area of the coil remain as large as possible. Thus the coil is desirably not folded over past 90°, and ideally is folded over at the inner edge of one long side of the coil. It is also desirable that as many turns of the longside as possible be included within the folded over portion. It has been found that coils such as specified hereinafter when folded over adjacent a long side so that all turns in that side were positioned at 90° to the remainder of the coil, exhibited an approximate 10% reduction in system coverage, i.e., that the distances at which the marker could be detected was approximately 10% less than that at which the same marker in an unfolded, planar configuration could be detected. While such a reduction in sensitivity is not insignificant, the marker performance remains adequate for many installations.

In the following, the detectability of various embodiments of the marker according to the present invention are explained in detail.

The area of the coil included within a circuit resonant at least one frequency within the given range of frequencies, so as to be detected by an EAS system, has a positive correlation with the Q value of the LC circuit. Accordingly, in order to obtain the highest Q value within the range of the given frequencies, thereby optimizing detectability, the area of the planar coil is desirably made as large as possible.

Then, with regard to the marker according to the present invention, markers were constructed using three different shapes of bent coils, each of which was made to resonate at 5 different frequencies by supplying a capacitor having the appropriate capacitance, and the Q values were measured for each. The capacitance and Q values of these fifteen marker circuits are set forth in Table 1.

1 was measured in an EAS system such as Model ET-2000, manufactured by Minnesota Mining and Manufacturing Company. The distances from the transmitting antenna at which the markers could no longer be detected are shown in Table 2.

TABLE 2

| LC circuit | (Coil) Wire length 2400 mm I.D. 100 mm × 5 mm (Capacitor) 151 pF | (Coil) Wire length 2200 mm I.D. 95 mm × 12 mm (Capacitor) 131 pF | (Coil) Wire length 2600 mm I.D. 95 mm × 12 mm (Capacitor) 91 pF |
|---|---|---|---|
| When not mounted on CD | 90 cm | 105 cm | 110 cm |
| When not mounted on CD | 90 cm | 105 cm | 100 cm |

Note 1: This experiment was done under a circumstance having very little noise from outside.

As explained above, the resonant marker for use with RF-EAS systems according to the present invention requires no separate hard case on which it is to be mounted, and can be mounted directly on an article to be detected without need of any space for it. Even if the article to be detected is partially shielded from radio frequency fields, the portion of the coil lying outside the shielded area enables satisfactory detection.

We claim:

1. A resonant marker adapted to be secured to an article and detected by a radio frequency electronic article surveillance (EAS) system, in which the marker includes a resonant inductive-capacitive circuit comprising a flat coil, characterized by a section of the coil being bent away from the plane of the main portion of said planar coil, thereby allowing the coil to be affixed to an edge of a substantially planar article having an extended piece which is conductive, such that the section of the coil out of the plane is also out of the plane of the conductive area.

TABLE 1

| Coil | Wire length 2400 mm I.D. 100 mm × 5 mm | | Wire length 2200 mm I.D. 95 mm × 12 mm | | Wire length 2600 mm I.D. 95 mm × 12 mm | |
|---|---|---|---|---|---|---|
| Frequency (MHZ) | Capacitor (pF) | Q value | Capacitor (pF) | Q value | Capacitor (pF) | Q value |
| 4.3 | 170 | 85 | 155 | 102 | 109 | 131 |
| 4.4 | 163 | 91 | 147 | 105 | 103 | 131 |
| 4.5 | 155 | 90 | 142 | 102 | 97 | 131 |
| 4.6 | 148 | 94 | 134 | 107 | 94 | 127 |
| 4.7 | 141 | 100 | 128 | 108 | 89 | 131 |

Note 1: The cable used for preparing the coils comprised an insulated wire of 0.32 mm in diameter (0.67 mm in diameter including PVC coating).
Note 2: The capacitor capacity and the Q value were measured by a Q-meter.
Note 3: The bent coil portion is a side of the long side portion of the planar coil.
Note 4: The I.D. refers to the inside diameter of the planar coil prior to folding. Depending on the wire length and I.D., the total number of turns ranged between approximately 9–11 turns.

Furthermore, the detectability at which marker circuits similar to those described in the examples of Table

* * * * *